United States Patent [19]
Daniel et al.

[11] Patent Number: 6,096,625
[45] Date of Patent: Aug. 1, 2000

[54] METHOD FOR IMPROVED GATE OXIDE INTEGRITY ON BULK SILICON

[75] Inventors: David W. Daniel, Divide; Theodore C. Moore, Woodland Park; Crystal J. Hass, Colorado Springs, all of Colo.

[73] Assignee: LSI Logic Corporation, Milpitas, Calif.

[21] Appl. No.: 08/954,006

[22] Filed: Oct. 20, 1997

Related U.S. Application Data

[63] Continuation of application No. 08/720,514, Sep. 30, 1996, abandoned.

[51] Int. Cl.[7] .................................................. H01L 21/322
[52] U.S. Cl. ........................ 438/473; 438/471; 438/474; 438/517
[58] Field of Search ................. 437/11, 28, 34, 437/57, 1; 438/471, 473, 474, 517

[56] References Cited

U.S. PATENT DOCUMENTS

| | | | |
|---|---|---|---|
| 4,001,049 | 1/1977 | Baglin et al. | 148/1.5 |
| 5,290,718 | 3/1994 | Fearson et al. | 437/34 |
| 5,293,508 | 3/1994 | Shiratake et al. | 250/492.21 |
| 5,387,552 | 2/1995 | Iranmanesh | 437/31 |
| 5,420,513 | 5/1995 | Kimura | 324/551 |
| 5,429,955 | 7/1995 | Joyner et al. | 437/26 |
| 5,445,975 | 8/1995 | Gardner et al. | 437/10 |
| 5,474,946 | 12/1995 | Ajit et al. | 437/41 |

OTHER PUBLICATIONS

Wolf et al., *Silicon Processing For the VLSI Era*, Lattice Press, 1990, pp. 327–332, 423–424.

Ghandi, *VLSI Fabrication Principles*, Wiley & Sons, 1983, pp. 353–354.

*Primary Examiner*—John F. Niebling
*Assistant Examiner*—Lynne A. Gurley

[57] ABSTRACT

The present invention provides a method for manufacturing a semiconductor device on a substrate. The process involves denuding the substrate by heating to create a denuded zone within the substrate. A screen oxide layer is formed prior to implanting ions into the substrate. This oxide layer remains during the implantation step. The screen oxide layer is removed when forming gates for the semiconductor device.

28 Claims, 10 Drawing Sheets

METHOD FOR IMPROVED GATE OXIDE INTEGRITY ON BULK SILICON

This is a continuation of application Ser. No. 08/720,514 filed on Sep. 30, 1996, now abandoned.

BACKGROUND OF THE INVENTION

1. Technical Field

The present invention relates generally to the field of semiconductor fabrication and in particular to an improved method for fabricating semiconductor devices on bulk silicon substrates. Still more particularly, the present invention relates to a method for increasing gate oxide integrity in semiconductor devices fabricated on bulk silicon substrates.

2. Description of the Related Art

Silicon is presently the most important semiconductor in the electronics industry. Semiconductor fabrication involves the processing of substrates, in particular silicon substrates, to pattern, grow, implant, and deposit various materials and ions on and into the substrate to form monolithic devices. Semiconductor devices have been created both on bulk and epitaxial silicon. Gate oxide integrity using bulk silicon has historically shown poor lifetime and poor charge to breakdown results as compared to gate oxide grown on epitaxial silicon with standard well processing flows. Therefore, it would be advantageous to have an improved method for manufacturing semiconductors on bulk silicon with improved gate oxide integrity.

SUMMARY OF THE INVENTION

The present invention provides a method for manufacturing a semiconductor device on a substrate. The process involves denuding the substrate by heating to create a denuded zone within the substrate. A screen oxide layer is formed prior to implanting ions into the substrate. This oxide layer remains during the implantation step. The screen oxide layer is removed when forming gates for the semiconductor device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

The process steps and structures described below do not form a complete flow for manufacturing integrated circuits. The present invention can be practiced in conjunction with the integrated circuit fabrication techniques currently used in the art, and only so much of the commonly practiced process steps are included as are necessary for an understanding of the present invention. The figures representing cross-sections of portions of an integrated circuit during fabrication are not drawn to scale, but are drawn so as to illustrate the important features of the invention.

Figure 1A:
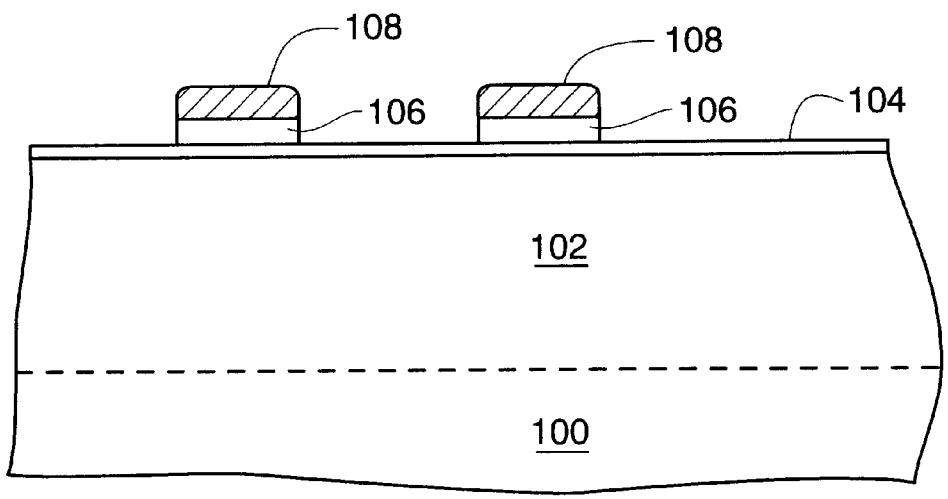
FIGS. 1A–1B depict initial processing steps prior to forming gate oxides according to the present invention.
Figure 1B:
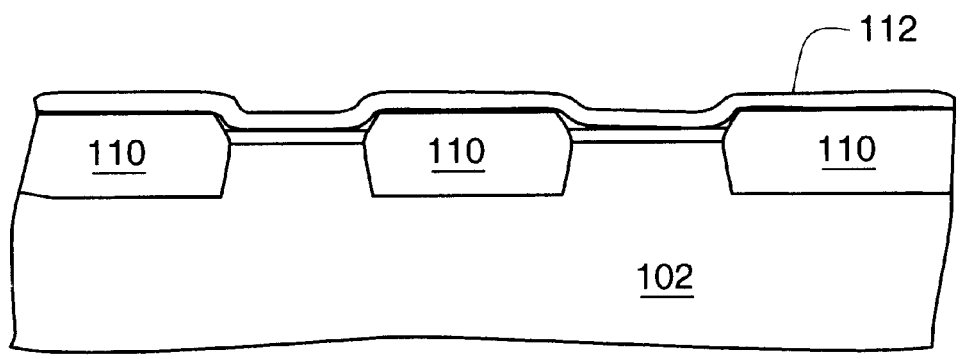

With reference now to the figures and in particular with reference to FIGS. 1A and 1B, initial processing steps prior to forming gate oxides are depicted according to the present invention. Referring now to FIG. 1A, substrate 100 includes a denuded zone 102. In the depicted example, substrate 100 is a silicon substrate with a p-doping. A pad oxide layer 104 is formed on the surface of substrate 100. This pad oxide is from about 50 Å to about 325 Å thick. Denuded zone 102 is formed by annealing substrate 100 using a temperature from about 900° C. to about 1150° C. Pad oxide 104 is formed after forming denuded zone 102 in substrate 100. Additionally, nitride layer 106 is formed over pad oxide 104 with photoresist layer 108 being formed on silicon nitride layer 106. In the depicted example, silicon nitride layer 106 is from about 1200 Å to about 2500 Å thick.

Thereafter, the layers are masked and etched to form the structures illustrated in FIG. 1A. Next, photoresist layer 108 is removed and field oxide 110 is formed. Nitride layer 106 and any oxynitride formed during processing are removed with screen oxide layer 112 then being formed over pad oxide layer 104 to form the structures depicted in FIG. 1B. Screen oxide layer 112 is from about 50 Å to about 500 Å thick in the depicted example.

Figure 2A:
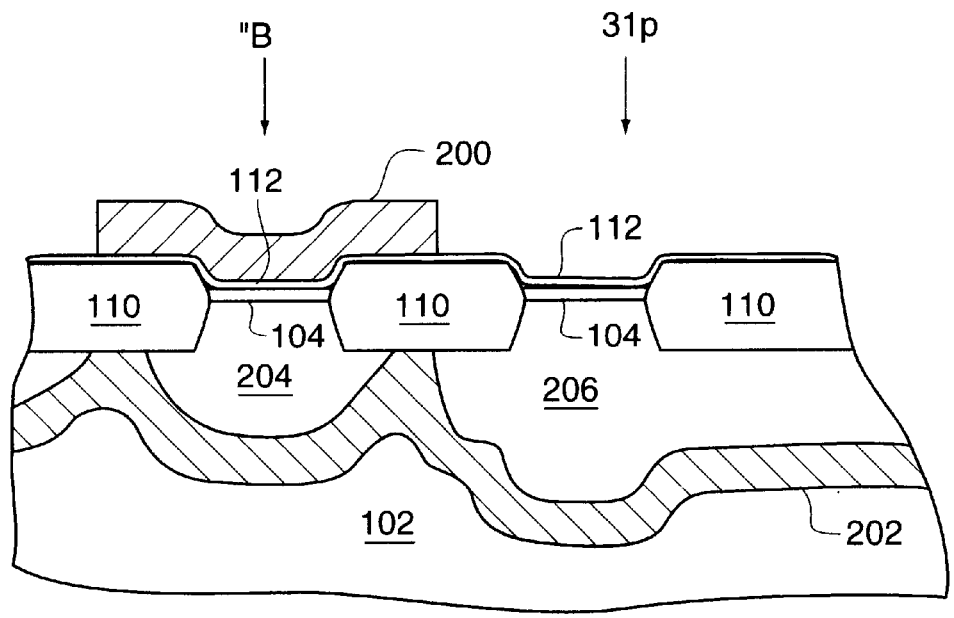
FIGS. 2A–2B depict a process flow for a buried implant layer for lateral isolation according to the present invention.
Figure 2B:
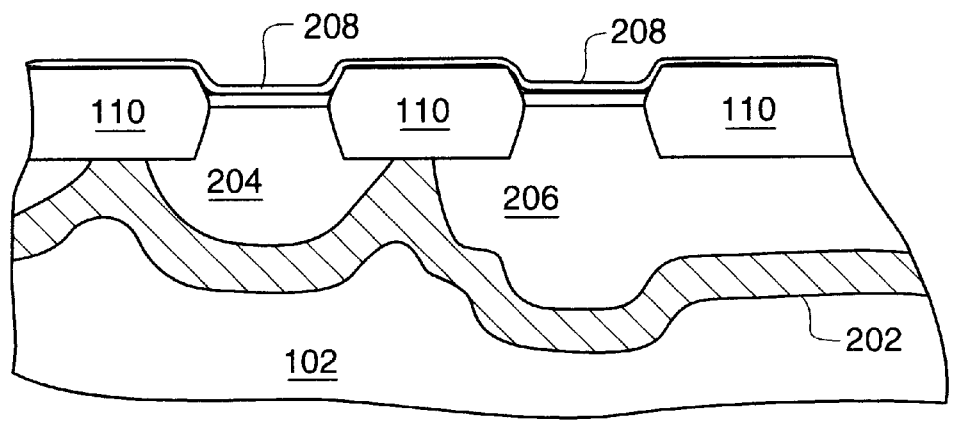

With reference now to FIGS. 2A and 2B, cross sections illustrating a process flow for a buried implant layer for lateral isolation are depicted according to the present invention. This process picks up from the structures in FIG. 1B. The process employs two masks in FIG. 2A. Photoresist layer 200 is formed on the device and etched as depicted in FIG. 2A. Photoresist layer 200 is from about 1.3 $\mu$m to 4 $\mu$m in the depicted example. A p+ buried layer implant is performed to form buried layer 202. In the depicted example, a dose of boron is implanted in a concentration from about 5E12 cm$^{-2}$ to about 3E15 cm$^{-2}$ at an energy level from about 1.4 MeV to about 2.6 MeV. The boron is a $^{11}$B isotope of boron. Next, a deep p+ implant is performed to form P-well 204. This implantation is performed using $^{11}$B in a dose from about 5E10 cm$^{-2}$ to about 2E13 cm$^{-2}$ at an energy level from about 800 KeV to about 1800 KeV.

Next, N-well region 206 is formed. An N+ retrograde implant is performed to form N-well region 206 using phosphorus in the form of a $^{31}$P of phosphorus in a dose from about 5E12 cm$^{-2}$ to about 3E14 cm$^{-2}$ at an energy level from about 400 KeV to about 1800 KeV. Thereafter, an N+ channel stop implant is performed using a dose of $^{31}$P from about 1E11 cm$^{-2}$ to about 1E13 cm$^{-2}$. This channel stop implant is performed at an energy level from about 50 KeV to about 200 KeV.

In FIG. 2B, photoresist layer 200 has been stripped from the device and a sacrificial oxide layer 208 is formed over the screen oxide. Sacrificial oxide layer 208 is from about 50 Å to about 300 Å thick in the depicted example. Optionally, before forming sacrificial oxide layer 208, the device may be annealed in nitrogen from about 600° C. to about 950° C. in the depicted example. Thereafter, the device is processed to form gate structures for the semiconductor device.

Figure 3A:
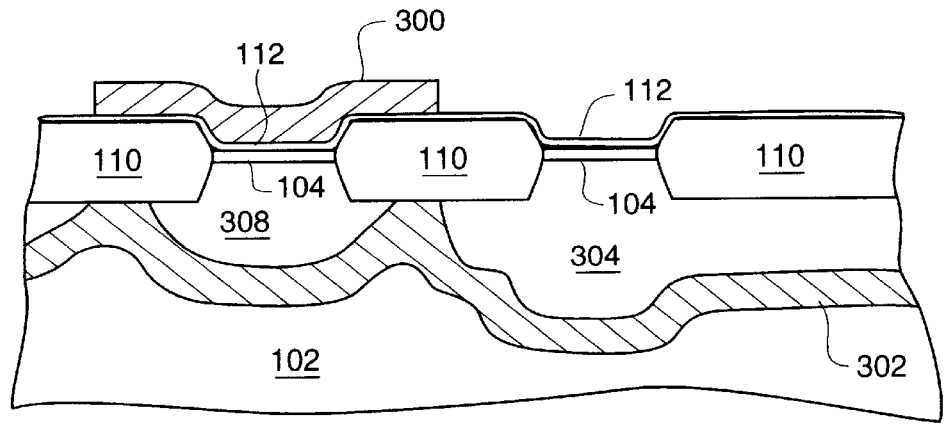
FIGS. 3A–3C depict cross sections of a device illustrating the steps used in forming a buried implant layer for lateral isolation according to the present invention.
Figure 3B:
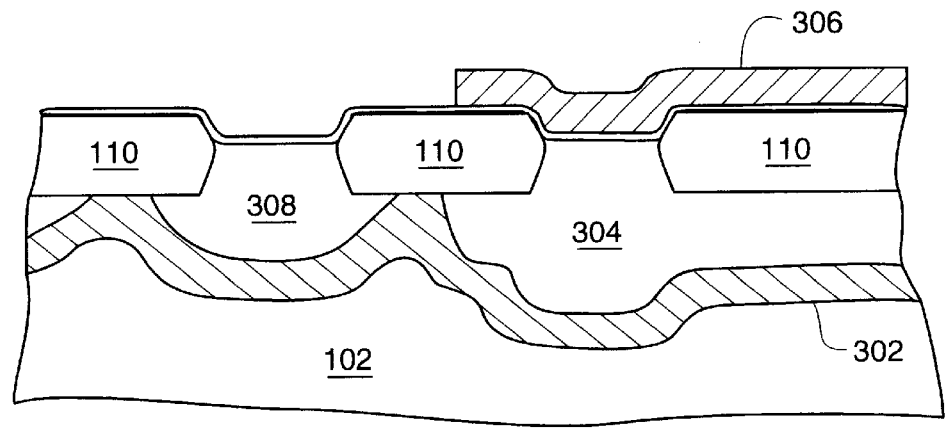
Figure 3C:
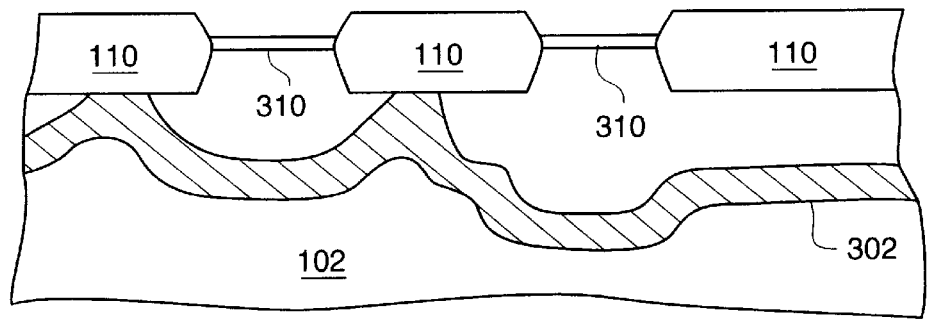

With reference now to FIGS. 3A–3C, cross sections of a device illustrating a process used in forming a buried implant layer for lateral isolation are depicted according to the present invention. These steps show the use of three masks. The processing described in these figures start from FIG. 1A. As can be seen, FIG. 3A shows a photoresist layer 300 that has been formed an etched on the device. In the depicted example, photoresist layer 300 has a thickness from about 1.3 µm to about 4.0 µm.

A P+ buried layer implant is performed using $^{11}$B in a dose from about 5E12 to about 3E15 in the depicted example. This implant is performed from about 1400 KeV to about 2600 KeV. This implant results in the formation of buried layer 302.

Next, N-well 304 is formed. Photoresist layer 300 is employed in forming N-well 304. A N+ retrograde implant is performed. In the depicted example, the retrograde implant is performed with $^{31}$P isotope of phosphorous in a dose from about 5E12 cm$^{-2}$ to about 3E14 cm$^{-2}$ at an energy level from about 400 KeV to about 1800 KeV. A N+ channel stop implant is then performed using the same dopant in a dose from about 1E11 cm$^{-2}$ to about 1E13 cm$^{-2}$ at an energy level from about 50 KeV to about 200 KeV.

Thereafter, photoresist layer 300 is removed and a photoresist layer 306 is formed and etched as illustrated in FIG. 3B. Photoresist layer 306 has a thickness from about 1.3 µm to about 4.0 µm and is employed in forming a P-well in the device in the depicted example. Next, P-well 308 is formed. In the depicted example, $^{11}$B is implanted in a dose from about 1E12 cm$^{-2}$ to about 3E14 cm$^{-2}$ at an energy level from about 200 KeV to about 1000 KeV. A P+ channel stop implant is then performed using the same type of dopant in a dose from about 1E10 cm$^{-2}$ to about 2E13 cm$^{-2}$ at an energy level from about 20 KeV to about 150 KeV. Thereafter, photoresist layer 306 is removed from the device and optionally, the device may be annealed at a temperature from about 650° C. to about 950° C. in nitrogen gas. The screen oxide and pad oxide layers are removed after the annealing step if performed. Then, in FIG. 3C sacrificial oxide layer 310 is formed on the device. Sacrificial oxide layer has a thickness from about 50 Å to about 300 Å in the depicted example.

Figure 4A:
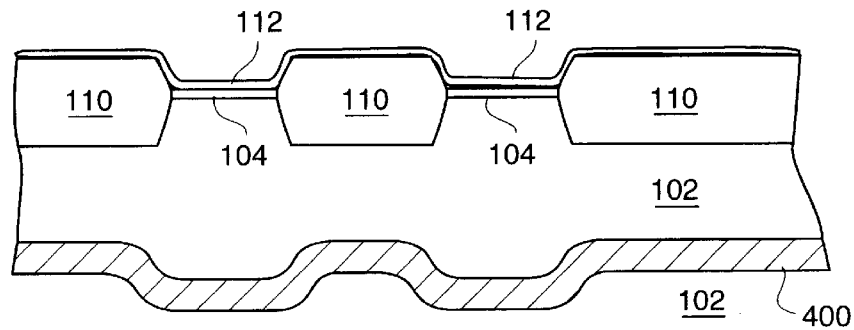
FIGS. 4A–4D illustrate cross sections of a semiconductor device depicting a process flow for forming a buried layer for lateral isolation according to the present invention.
Figure 4B:
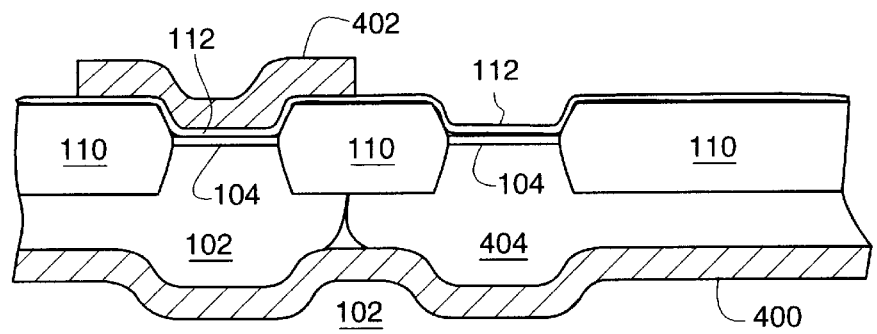

With reference now to FIGS. 4A–4D, cross sections of a semiconductor device depicting a process flow for forming a buried layer for lateral isolation are illustrated according to the present invention. The process begins from the structure in FIG. 1B using a P+ buried layer implant to form buried layer 400 as illustrated in FIG. 4A. This step is performed using a $^{11}$B isotope of boron in a dose from about 5E12 cm$^{-2}$ to about 5E15 cm$^{-2}$ at an energy level from about 1400 KeV to about 2600 KeV. Thereafter, photoresist layer 402 is formed on the device and etched as shown in FIG. 4B. This photoresist layer has a thickness from about 1.3 µm to about 4.0 µm in the depicted example. With photoresist layer 402 in place, N-well 404 is then formed. An N+ retrograde implant is performed using $^{31}$P in a dose from about 5E12 cm$^{-2}$ to about 3E14 cm$^{-2}$. The dopants are implanted at an energy level from about 400 KeV to about 1800 KeV in the depicted example. Next, an N+ channel stop implant is performed. In the depicted example, $^{31}$P in a dose from about 1E11 cm$^{-2}$ to about 1E13 cm$^{-2}$ is implanted at an energy level from about 50 KeV to about 200 KeV.

Figure 4C:
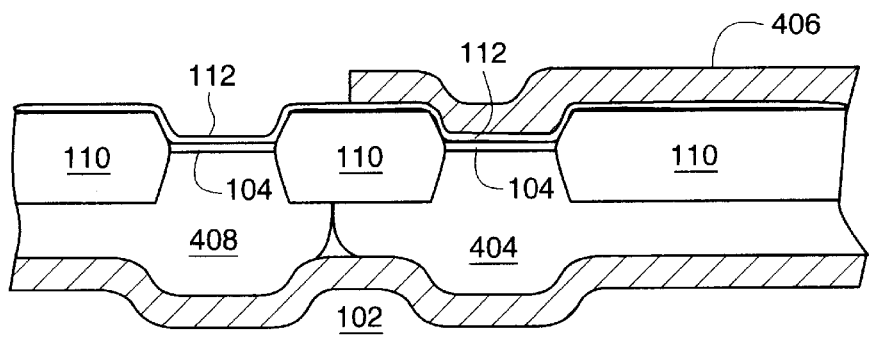
Figure 4D:
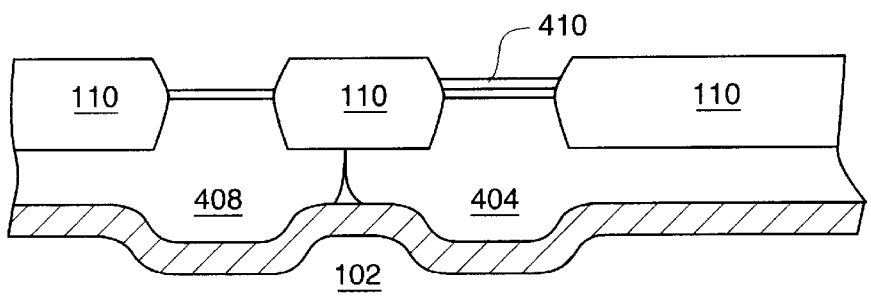

Next, photoresist layer 402 is removed and photoresist layer 406 is formed and patterned then etched as illustrated in FIG. 4C. In the depicted example, photoresist layer 402 has a thickness from about 1.3 µm to about 4.0 µm. Thereafter, P-well 408 is formed with photoresist layer 406 in place. The P-well is formed by employing a P+ retrograde implant. In the depicted example, this retrograde implant is performed using $^{11}$B in a dose from about 1E12 cm$^{-2}$ to about 3E14 cm$^{-2}$. The dopants are implanted using an energy level from about 200 KeV to about 1000 KeV. Then, a P+ channel stop implant is performed. The same type of dopant is implanted at an energy level from about 20 KeV to about 150 KeV in a dose from about 1E10 cm$^{-2}$ to about 2E13 cm$^{-2}$. Thereafter, photoresist layer 406 is removed, and optionally, the device may be annealed. In the depicted example, the device may be annealed at a temperature from about 650° C. to about 950° C. The screen oxide and pad oxide layers are removed after the annealing step if performed. Then, a sacrificial oxide layer 410 is deposited as illustrated in FIG. 4D. Sacrificial oxide layer 410 is from about 50 Å to about 300 Å thick in the depicted example. Thereafter, gates are formed for the device in further processing steps not shown.

Figure 5A:
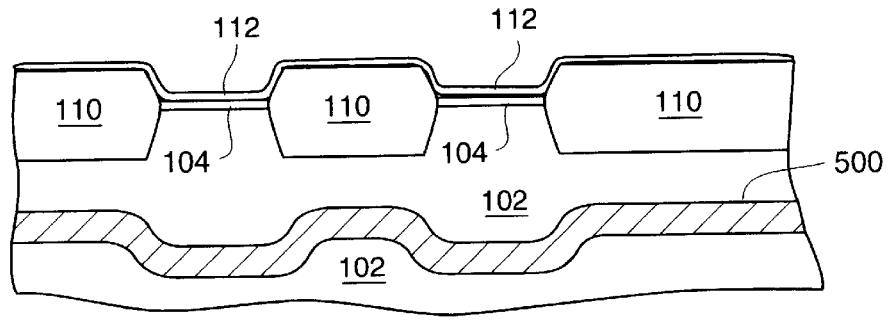
FIGS. 5A–5D illustrate cross sections depicting the process used for creating a buried layer/connecting layer for lateral isolation according to the present invention.
Figure 5B:
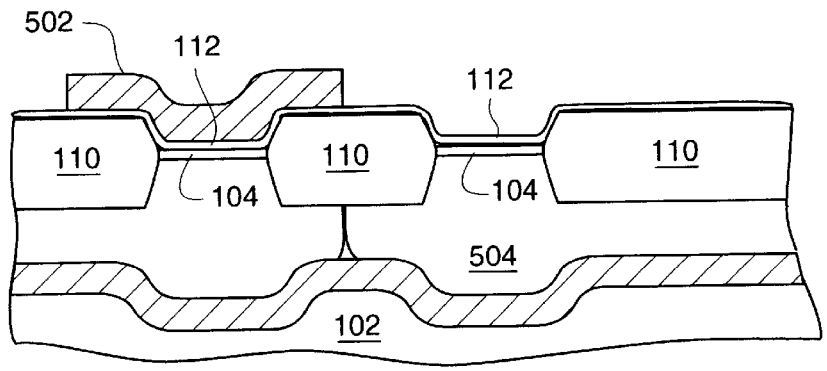
Figure 5C:
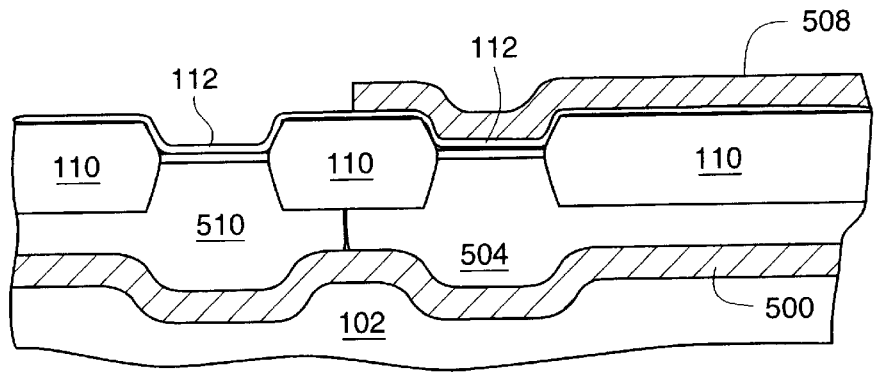

With reference now to FIGS. 5A–5C, cross sections depicting a process flow used for creating a buried layer/connecting layer for lateral isolation are illustrated according to the present invention. The process begins by performing a buried layer implant on the structure depicted in FIG. 1B to form buried layer 500 as shown in FIG. 5A. Buried layer 500 is a P+ buried layer in the depicted example and is formed by implanting a $^{11}$B isotope of boron in a dose from about 5E12 cm$^{-2}$ to about 5E15 cm$^{-2}$ at an energy level from about 1400 KeV to about 2600 KeV. In FIG. 5B, a photoresist layer 502 has been formed and etched and is from about 1.3 µm to about 4.0 µm thick. Then, an N-well 504 is formed. N-well 504 is formed in the depicted example by performing a N+ retrograde implant and an N-channel stop implant. The N+ retrograde implant is performed by implanting a $^{31}$P isotope of phosphorous in a dose from about 5E12 cm$^{-2}$ to about 3E14 cm$^{-2}$ using an energy level from about 400 KeV to about 1800 KeV. The N+ channel stop implant is performed using $^{31}$P in a dose from about 1E11 cm$^{-2}$ to about 1E13 cm$^{-2}$ at an energy level from about 50 KeV to about 200 KeV.

Figure 5D:
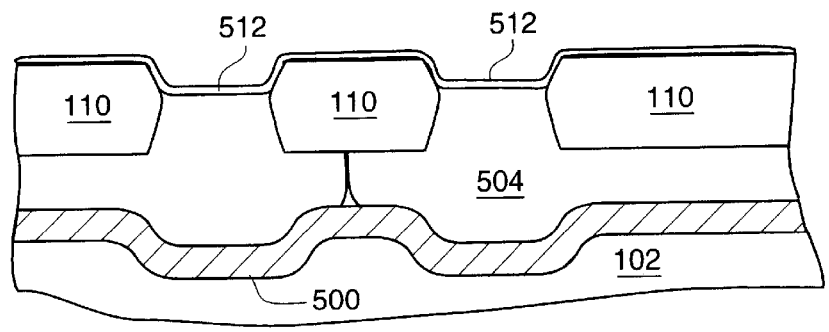

Thereafter, photoresist layer 502 is stripped from the device and a photoresist layer 506 is formed and etched as shown in FIG. 5C. Photoresist layer 508 is about 1.3 µm to about 4.0 µm thick in the depicted example. Thereafter, P-well 510 is formed using a P+ connecting layer implant, a P+ retrograde implant, and a P+ channel stop implant. In the depicted example, the connecting layer implant is performed using $^{11}$B at a dose from about 3E12 cm$^{-2}$ to about 3E14 cm$^{-2}$. This implant is performed at an energy level from about 400 KeV to about 1400 KeV. The retrograde implant is performed using the same dopant in a concentration from about 1E12 cm$^{-2}$ to about 3E14 cm$^{-2}$ at an energy level from about 200 KeV to about 1000 KeV. The P+ channel stop implant is then performed at an energy level from about 20 KeV to about 150 KeV using a concentration of $^{11}$B from about 1E10 cm$^{-2}$ to about 2E13 cm$^{-2}$. Thereafter, photoresist layer 506 is removed from the device. At this point, the device may be annealed. Annealing is performed from about 650° C. to about 950° C. in nitrogen gas in the depicted example. This annealing step may be skipped. The screen oxide and pad oxide layers are removed after the annealing step if performed. Afterwards, a sacrificial oxide layer is formed on the device as shown in FIG. 5D. In the depicted example, the sacrificial oxide layer 512 is from about 50 Å to about 300 Å thick. Thereafter, gates are formed for the device using conventional processing.

As with the annealing of the device, the use of the sacrificial oxide layer is optional. Alternatively, a gate oxide layer may be placed on the screen oxide.

Figure 6A:
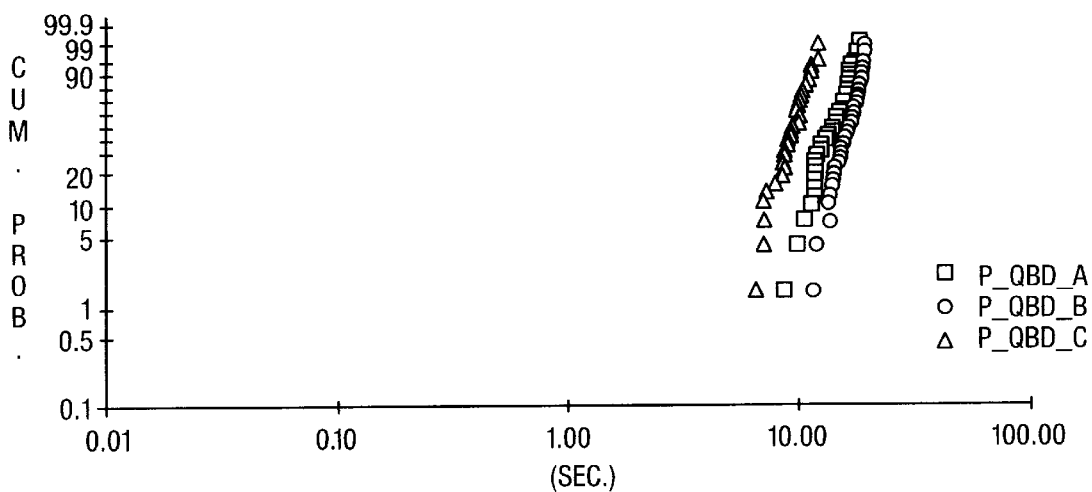
FIGS. 6A–6C are plots of device failure probabilities for a PMOS device are depicted.
Figure 6B:
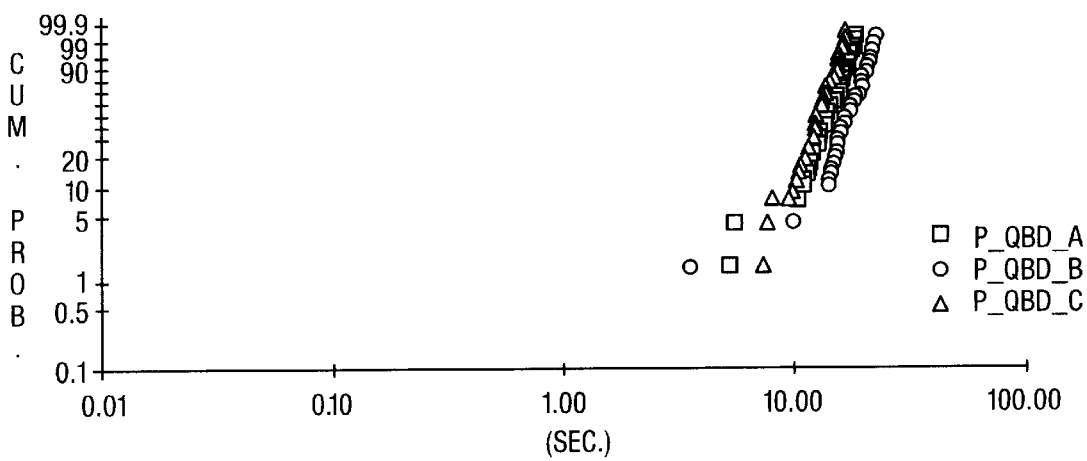
Figure 6C:
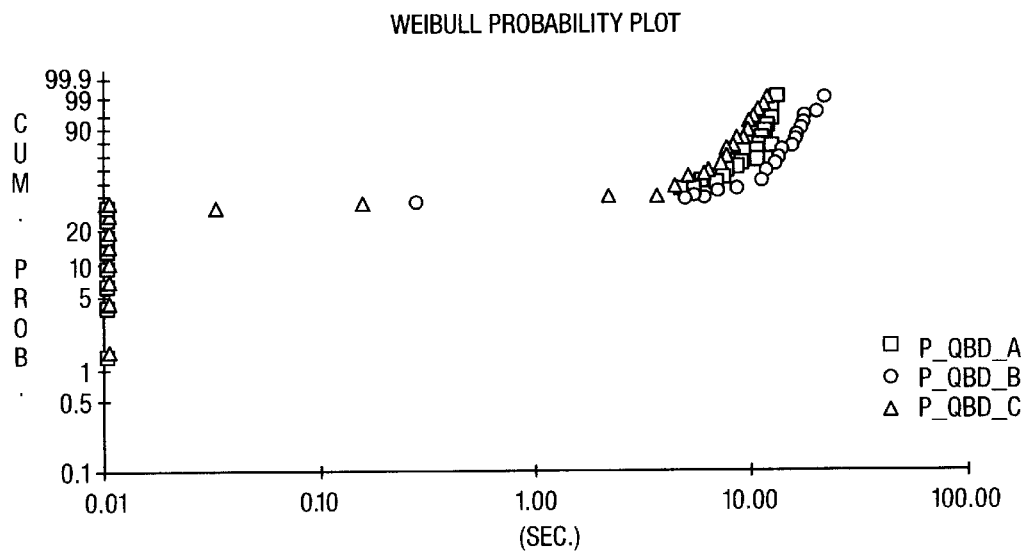

With reference now to FIGS. 6A–6C, plots of device failure probabilities for a PMOS device are depicted. FIG. 6A depicts a cumulative probability plot for a PMOS device on epitaxial silicon. This probability plot is a charge to breakdown (QBD) plot to show breakdown characteristics for the devices. The Y-axis shows the percent of devices failed for a certain amount of time and the X-axis (logarithmic) shows the number of seconds that have passed. In these plots, the gates were biased until failure occurred. Three types of device structures are indicated by the triangle, square, and circle symbols in the plot. PMOS devices processed on silicon using the denuding step and the screen oxide step show similar reliabilities in FIG. 6B, while PMOS devices processed on bulk silicon without a screen oxide step show varied reliabilities. As can be seen, the screen oxide is necessary for acceptable gate oxide integrity according to the present invention.

Figure 7A:
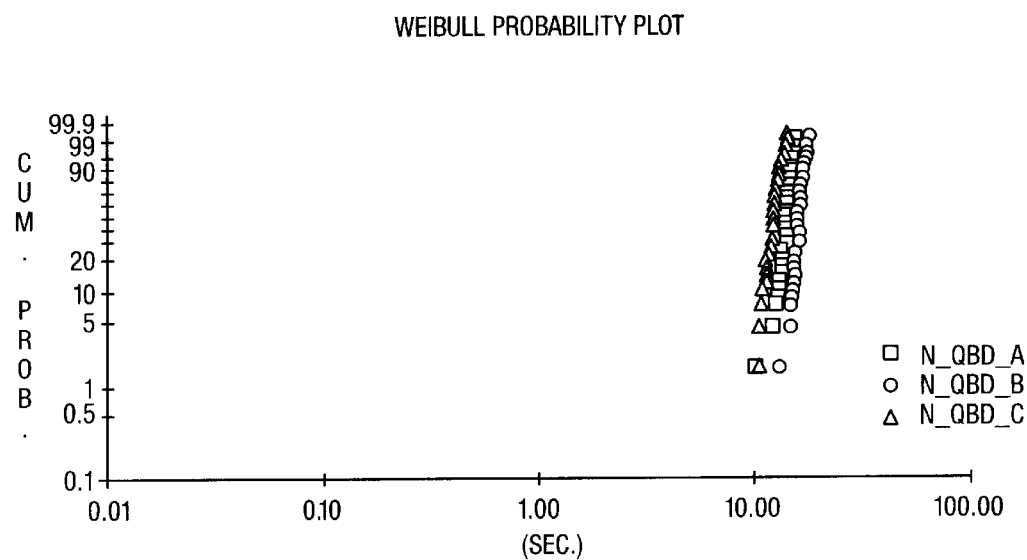
FIGS. 7A–7B are probability plots of a NMOS device reliability are depicted.
Figure 7B:
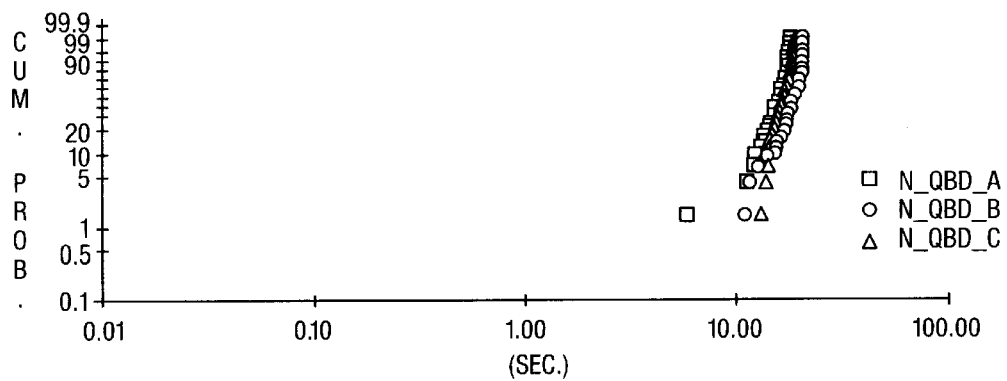

With reference now to FIGS. 7A–7B, probability plots of device reliability are depicted. The Y-axis shows the percent of devices failed for a certain amount of time and the X-axis (logarithmic) shows the number of seconds that have passed. In these plots, the gates were biased until failure occurred. FIG. 7A shows an NMOS device on epitaxial silicon while FIG. 7B, shows an NMOS device on bulk silicon using the denuding step and the screen oxide step according to the present invention.

Figure 8A:
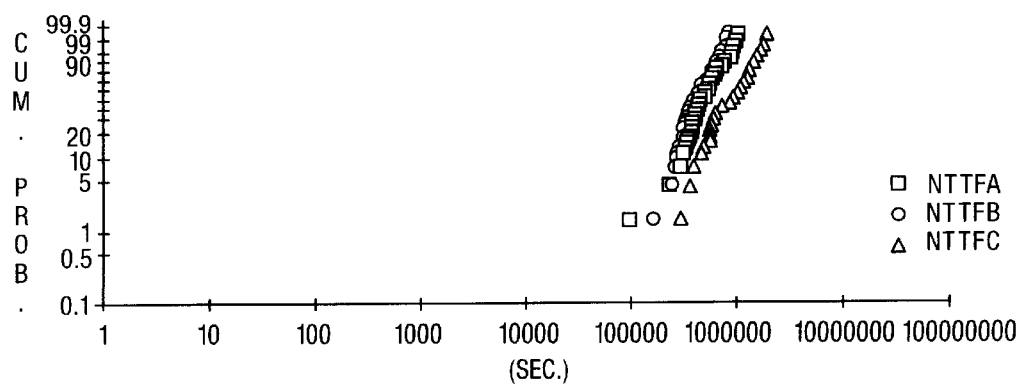
FIGS. 8A–8B are probability plots for a NMOS device based on time dependent dielectric breakdown (TDDB) characteristics.
Figure 8B:
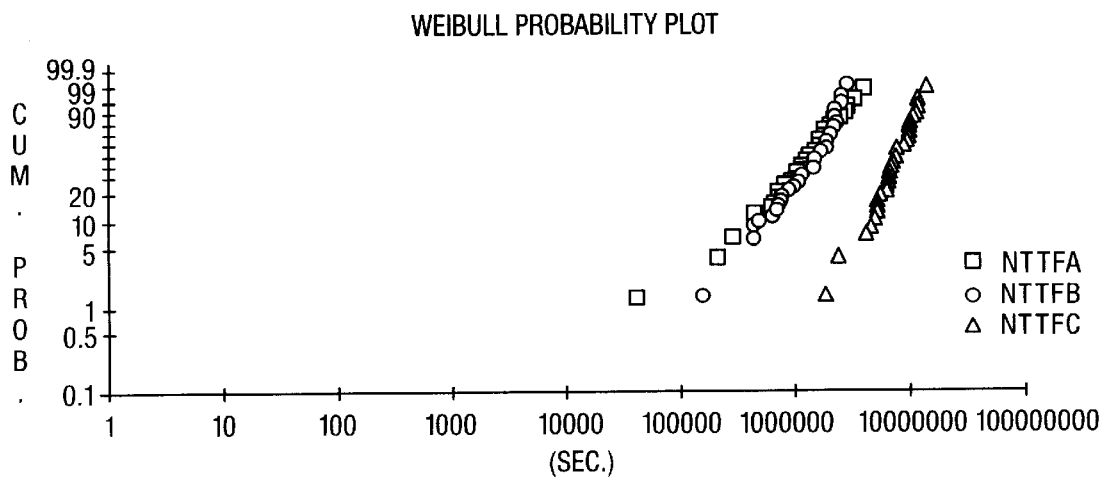

FIGS. 8A and 8B illustrate a cumulative probability plot for a NMOS device based on time dependent dielectric breakdown (TDDB) characteristics. The Y-axis shows the cumulative probability of device failure while the X-axis (logarithmic) illustrates the failure after a set amount of time. In these plots, a constant voltage was applied to the structure until failure. FIG. 8A is a plot of structures on an NMOS device on epitaxial silicon while FIG. 8B shows structures on an NMOS device on bulk silicon with a screen oxide processed according to the present invention.

Figure 9A:
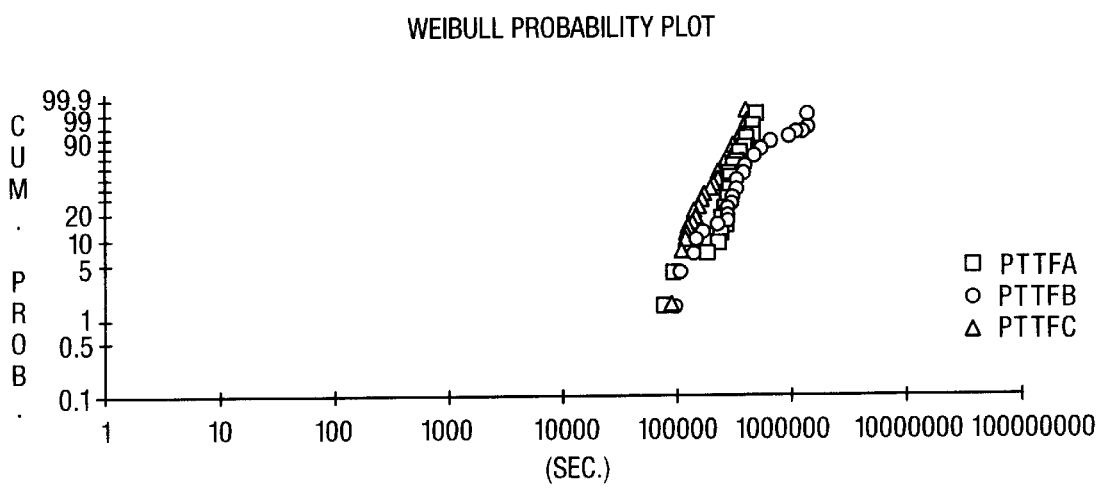
FIGS. 9A–9C are probability plots of reliability for a PMOS device.
Figure 9B:
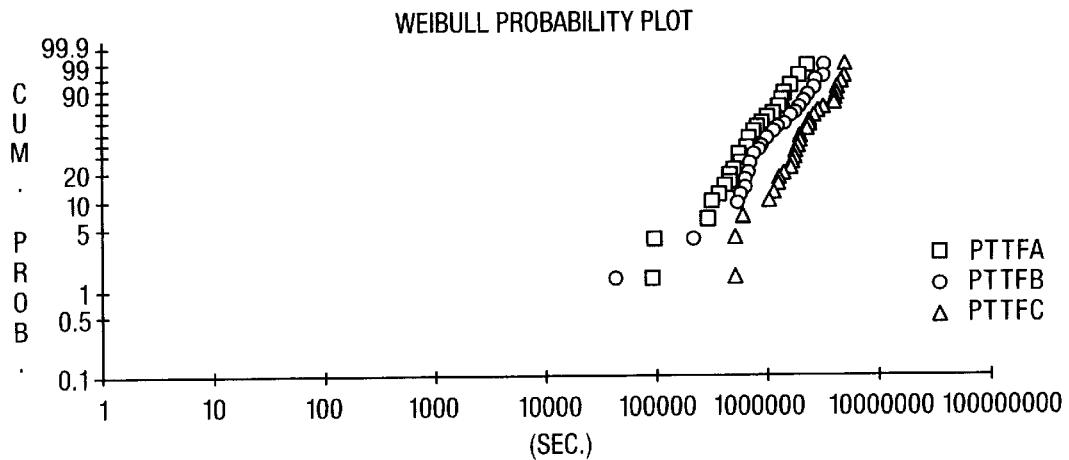
Figure 9C:
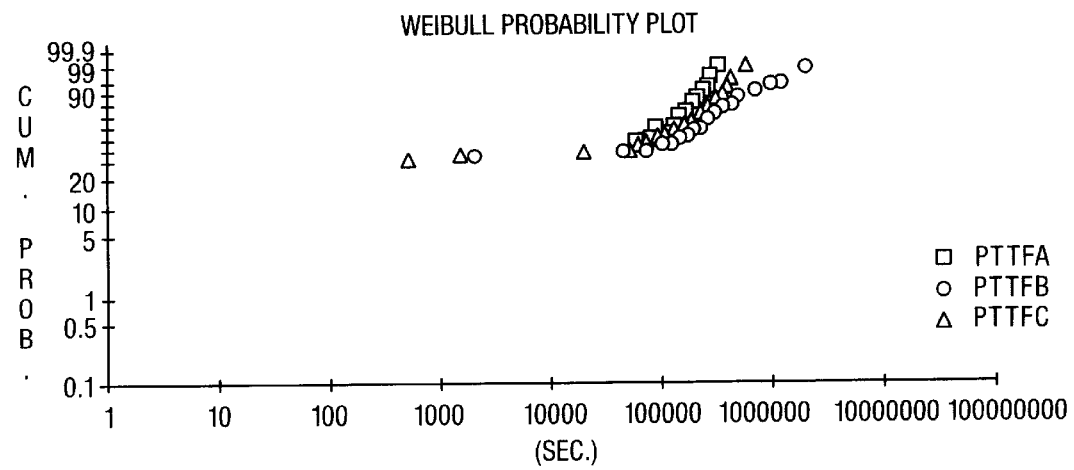

FIGS. 9A–9C depict plots of a device for reliability for a PMOS device. FIG. 9A illustrates PMOS device reliability based on time dependent dielectric breakdown (TDDB) characteristics on epitaxial silicon. The Y-axis shows the cumulative probability of device failure while the X-axis (logarithmic) illustrates the failure after a set amount of time. In these plots, a constant voltage was applied to the structure until failure. As can be seen in FIGS. 9B and 9C, the reliability of the gates in the PMOS device on bulk silicon is much better using the process of the present invention in contrast to PMOS devices processed without a screen oxide in combination with the denuded step.

Thus, the present invention provides an improved method for manufacturing semiconductor devices on bulk silicon. The present invention provides the advantage of improved gate oxide integrity in contrast to devices processed without the steps of the present invention. The present invention provides an improved process for increasing gate oxide integrity in a semiconductor device. This is especially advantageous on bulk silicon, which traditionally results in gate oxide integrities that are lower than that of epitaxial silicon. The high temperature denuding process along with the screen oxide prior to the N-well photoresist layer and subsequent high energy implants both serve to improve the integrity of the gate oxide. The use of a low temperature anneal also serves to improve the integrity of the gate oxide.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A method for manufacturing a semiconductor device on a substrate comprising:
   denuding by heating the substrate, wherein a denuded zone is created within the substrate;
   forming a pad oxide layer on the substrate;
   forming field oxide regions, wherein portions of the pad oxide layer in areas other than the field oxide regions form pad oxide regions;
   forming a screen oxide layer on the pad oxide regions; and
   implanting ions into the substrate after forming the screen oxide layer, wherein the screen oxide layer is sufficient to block a portion of the ions implanted into the substrate and is present over portions of the substrates in which ions are implanting into the substrate.

2. The method of claim 1 further comprising implanting ions into the substrate to form well regions within the substrate for the semiconductor device.

3. The method of claim 2 further comprising removing the screen oxide layer and forming a gate oxide layer and forming gate regions after removing the screen oxide layer.

4. The method of claim 3 further comprising forming gates for the semiconductor device in the gate regions.

5. The method of claim 1 further comprising annealing the semiconductor device after implanting ions into the substrate.

6. The method of claim 1 further comprising forming a pad oxide layer on the substrate prior to forming the screen oxide layer.

7. The method of claim 6 further comprising annealing the semiconductor device after implanting ions into the substrate.

8. The method of claim 7, wherein the annealing step is performed at a temperature from about 600° C. to about 950° C.

9. The method of claim 8, wherein the annealing step is performed in nitrogen gas.

10. The method of claim 1, wherein the denuding step is performed at a temperature from about 900° C. to about 1150° C.

11. The method of claim 6, wherein the pad oxide layer is from about 50 Å to about 325 Å thick.

12. The method of claim 1, wherein the screen oxide layer has a thickness from about 50 Å to about 500 Å.

13. A method for manufacturing a semiconductor device on a silicon substrate comprising:
   denuding the substrate by heating the substrate, wherein a denuded zone is formed within the substrate;
   forming a pad oxide layer on the substrate;
   forming a nitride layer on the pad oxide layer;
   etching the nitride layer, wherein portions of the nitride layer remain as a remaining nitride layer and regions of exposed pad oxide are formed;

forming field oxide regions in the regions of exposed pad oxide;

removing the remaining nitride layer and exposing the pad oxide layer under the remaining nitride layer; performing ion implantation into the substrate and forming a screen oxide layer on the pad oxide layer prior to performing ion implantation, wherein the screen oxide layer remains in place over portions of the substrate in which ion implantation occurs.

14. The method of claim 13, wherein the step of performing ion implantation into the substrate after forming the screen oxide layer includes:

implanting a buried layer of a first type of dopant;

implanting a well using a dopant of the first type; and implanting a second well using a dopant of the second type.

15. The method of claim 14, wherein the step of implanting a buried layer using the first type of dopant comprises implanting P-type dopants at a dose from about $5e12$ $cm^{-2}$ to about $3e15$ $cm^{-2}$.

16. The method of claim 14, wherein the step of implanting a well using the second type of dopant comprises implanting a P-type dopant at a dose from about $5e10$ $cm^{-2}$ to about $2e13$ $cm^{-2}$.

17. The method of claim 14, wherein the step of implanting a well of the second type of dopant comprises implanting N-type dopants at a dose from about $5e12$ $cm^{-2}$ to about $3e14$ $cm^{-2}$ and then implanting N-type dopants at a dose from about $1e11$ $cm^{-2}$ to about $1e13$ $cm^{-2}$.

18. The method of claim 13, further comprising annealing the semiconductor device after the step of performing ion implantation.

19. The method of claim 18, wherein the annealing step is performed in nitrogen gas.

20. The method of claim 13 further comprising:

performing a buried layer implant; and performing a retrograde implant and a channel stop implant to form a well within the denuded zone in the substrate.

21. The method of claim 20 further comprising annealing the semiconductor device after forming the well.

22. The method of claim 21 further comprising forming gates over the screen oxide layer.

23. The method of claim 13, wherein the pad oxide layer is from about 50 Å to about 325 Å thick.

24. The method of claim 13, wherein the screen oxide layer has a thickness from about 50 Å to about 500 Å.

25. The method of claim 13, wherein the silicon substrate is a bulk silicon substrate.

26. A method for manufacturing a semiconductor device on a substrate comprising:

denuding by heating the substrate, wherein a denuded zone is created within the substrate;

forming a pad oxide layer on the substrate;

forming field oxide regions, wherein portions of the pad oxide layer in areas other than the field oxide regions form pad oxide regions;

forming a screen oxide layer on the pad oxide regions;

implanting ions into the substrate after forming the screen oxide layer, wherein the screen oxide layer is sufficient to block a portion of the ions implanted into the substrate and is present over portions of the substrates in which ions are implanting into the substrate;

forming a sacrificial oxide layer on the semiconductor device after implanting ions into the substrate; and forming a gate structure after forming the sacrificial oxide layer, wherein the gate structure has improved gate oxide integrity.

27. The method of claim 26 further comprising annealing the semiconductor device after implanting ions into the substrate and prior to forming a sacrificial gate oxide layer.

28. The method of claim 27 further comprising removing the pad oxide layer and the screen oxide layer after annealing the semiconductor device and prior to forming the sacrificial oxide layer.

* * * * *